United States Patent [19]

Lutz

[11] 4,361,799
[45] Nov. 30, 1982

[54] OVER-TEMPERATURE SENSE AND LOCATE DEVICE

[75] Inventor: Michael A. Lutz, San Carlos, Calif.

[73] Assignee: Raychem Corporation, Menlo Park, Calif.

[21] Appl. No.: 338,409

[22] Filed: Jan. 8, 1982

Related U.S. Application Data

[63] Continuation of Ser. No. 134,354, Mar. 27, 1980, abandoned, which is a continuation-in-part of Ser. No. 88,344, Oct. 26, 1979, abandoned.

[51] Int. Cl.³ .................... G01R 31/08; G01R 27/26
[52] U.S. Cl. ..................................... 324/52; 219/505; 338/26; 361/274; 361/282; 374/114
[58] Field of Search ............ 73/34 Z, 362 R; 338/214, 22 R, 26; 324/52; 174/11 R; 361/282, 274; 340/596; 337/415; 219/505, 504

[56] References Cited

U.S. PATENT DOCUMENTS

| 1,329,432 | 2/1920 | Rogers ................................ 324/52 |
| 2,558,929 | 7/1951 | Bunish et al. ............. 174/120 SC X |
| 2,615,973 | 10/1952 | Heath, Jr. ................. 73/362 CP X |
| 3,211,002 | 10/1965 | Franklin .................... 73/362 CP |
| 3,284,704 | 11/1966 | Lamont ..................... 324/52 |
| 3,510,762 | 5/1970 | Leslie .................... 73/342 X |
| 3,705,257 | 12/1972 | Wade .................. 174/120 SC X |
| 3,735,025 | 5/1973 | Ling et al. .............. 174/120 SC |
| 3,793,716 | 2/1974 | Smith-Johannsen ............. 338/214 |
| 3,938,385 | 2/1976 | Horvath .................. 73/362 R X |
| 3,981,181 | 9/1976 | Ochiai . |
| 4,041,771 | 8/1977 | Allan et al. ................. 324/52 |
| 4,103,225 | 7/1978 | Stephens ................ 324/52 X |
| 4,143,238 | 3/1979 | Sheth ................... 174/102 SC |
| 4,177,376 | 12/1979 | Horsma et al. ............. 219/505 X |
| 4,189,367 | 2/1980 | Connery et al. .............. 324/51 X |
| 4,200,973 | 5/1980 | Forkas .................. 338/214 X |
| 4,246,468 | 1/1981 | Horsma .................. 219/505 X |

FOREIGN PATENT DOCUMENTS

| 1023102 | 7/1960 | Fed. Rep. of Germany . |
| 2458055 | 6/1976 | Fed. Rep. of Germany . |
| 653864 | 5/1951 | United Kingdom ............ 340/596 |
| 1520355 | 8/1978 | United Kingdom ............ 340/596 |
| 1543156 | 3/1979 | United Kingdom . |

*Primary Examiner*—Daniel M. Yasich
*Attorney, Agent, or Firm*—James W. Peterson

[57] ABSTRACT

The invention is an over-temperature sensor and locator utilizing a temperature sensitive cable comprising (1) an electrical conductor, (2) a dielectric, and (3) a solid, conductive polymeric, positive temperature coefficient of resistance composition. An over-temperature condition at any point along the cable is detected by a drop in the capacitance of the cable, as measured from one end of the cable. The location of the over-temperature point on the cable is determined by comparing the reduced capacitance from the control end to the over-temperature point with the capacitance of the full cable length.

20 Claims, 5 Drawing Figures

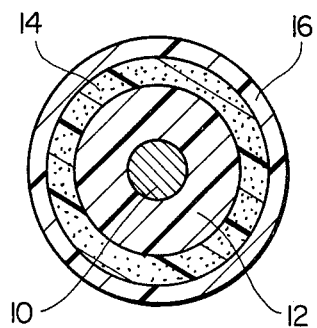
FIG_1
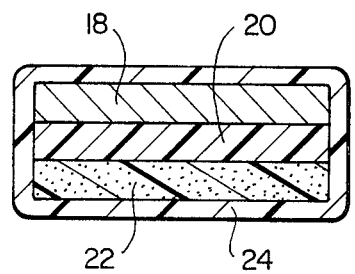
FIG_2
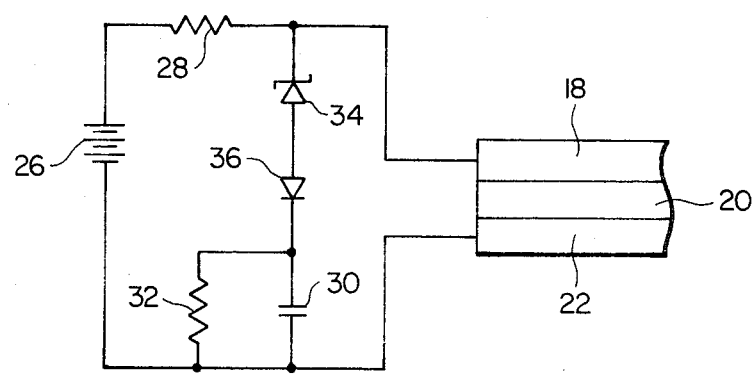
FIG_3

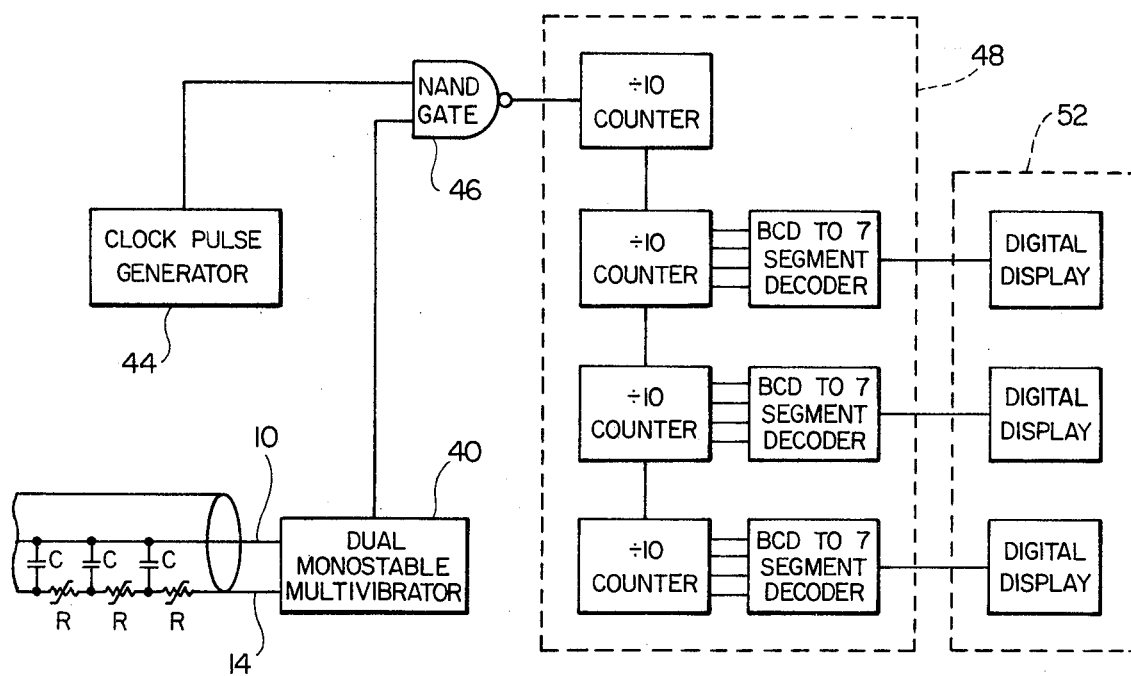
FIG_4
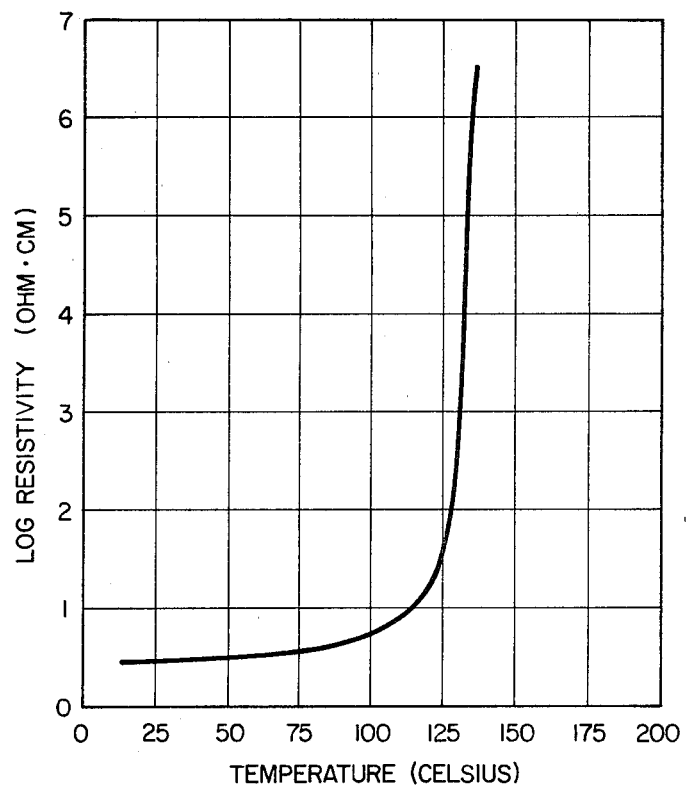
FIG_5

OVER-TEMPERATURE SENSE AND LOCATE DEVICE

CROSS REFERENCE TO RELATED APPLICATION

This is a continuation, of application Ser. No. 134,354, filed Mar. 27, 1980, now abandoned, which is a continuation-in-part of my co-pending application, Ser. No. 88,344, filed Oct. 26, 1979, now abandoned, the disclosure of which is incorporated herein by reference.

BACKGROUND OF THE INVENTION

Over-temperature detection is important for the protection of personnel and equipment. Electronic equipment will fail if allowed to exceed maximum temperature levels. Incipient mechanical equipment failure can be detected by sensing overheating and shutting down the equipment. Agricultural products, ammunition, power cables, etc. must all be stored or operated below maximum temperature levels to avoid damage.

Over-temperature at a single point is conventionally sensed by a bimetallic thermostat which is attached to the component to be protected and which is connected to a power supply. Such a thermostat is normally open and when the temperature of the component rises above the preset limit, the thermostat closes, connecting the power supply to an alarm, an indicator, or a control relay. For multiple point sensing, one power supply can be used for multiple thermostats. However, the primary difficulty with using discrete detectors such as thermostats is that the hot spot can occur between the detectors and either go unnoticed or be detected after the damage has been done.

The parameters commonly employed for continuous over-temperature sensing include pressure and resistance.

In pneumatic devices, i.e. those employing pressure sensing, a tube is pressurized with an inert gas. The application of heat causes an increase in pressure which operates a diaphragm that closes an electrical contact. Upon removing the heat, the pressure falls and the contact reopens.

Resistance sensors rely on a decrease in resistance at the "hot-spot" between two conductors separated by a dielectric. Meltable plastic devices utilize a twisted pair of wires, each wire encased in meltable plastic material. When the temperature exceeds the material's melting point, the wires touch. To reuse the sensor, the shorted section must be cut out and replaced. A continous thermistor cable comprises two conductors separated by continuous negative temperature coefficient of resistivity material. As the temperature of such cable rises, the resistance between the two conductors fails. Once the temperature falls, the resistance returns to its original high value. Eutectic salt type devices utilize a salt compound between two conductors. At the eutectic temperature, the compound melts and its resistance falls, connecting the conductors. When the temperature falls, the compound solidifies and the resistance returns to its original high value.

Each of the above discussed technologies place fundamental limitations on the construction and performance of continuus over-temperature sensors which do not exist in the present invention which utilizes conductive polymer technology. Specifically, the pneumatic tube devices are inherently incapable of determining hot spot location, since they sense only an increase in pressure within the tube. The meltable plastic material can only be used once and must then be repaired, and is, therefore, unable to serve as long lived monitor. The thermistor and eutectic salt devices require a metal casing for the sensor making it relatively inflexible, subject to corrosion, difficult to splice and expensive to manufacture.

Another parameter which is useful for temperature-sensitive continuous monitors is capacitance. Here, the increase in resistance of one conductor at the anomaly point—a hot or cold spot along the cable—varies the effective capacitance between that conductor and another, normally temperature-insensitive, conductor. Such a system is disclosed in U.S. Pat. No. 4,041,771, which discloses a temperature sensitive detector that senses capacitance changes in an elongated container which holds a body of material which changes phases at specific temperatures. Specifically, said patent discloses an inflexible tube containing a liquid which changes conductivity upon freezing and thereby changes the capacitance of the entire device. The use of a liquid to a solid phase-changing material limits such a device to only the structure disclosed, namely a liquid within a dielectric tube surrounded by a conductor. Furthermore, the teaching of a liquid type device would appear to be limited to the sensing of an under-temperature condition, since it is the increase in resistance which changes the capacitance in a measurable manner, by effectively changing the size of one of the plates of the capacitor.

The instant invention is an improvement over the above described device, said improvement comprising a flexible cable having (1) an electrical conductor, (2) a dielectric, and (3) a conductive positive temperature coefficient of resistance (hereinafter referred to as PTCR) polymeric composition in a geometric relationship such that the dielectric separates the electrical conductor from the conductive polymeric composition. Because the polymeric composition possesses a positive temperature coefficient of resistance, the cable acts as an over-temperature sensor, rather than the under-temperature sensor described in the previous paragraph. The instant invention also provides for a construction in which the temperature sensitive conductive polymer can be placed adjacent to the mass whose temperature is being monitored, i.e., people or equipment, thereby increasing sensitivity and response time of the total device.

The instant invention is a significant improvement over the prior art for three basic reasons. First, the instant invention utilizes a solid temperature sensitive material in the form of a conductive PTCR polymeric composition which is necessary for construction of practical reusable cables possessing flexibility, ruggedness and durability. Second, the use of solid temperature sensitive material makes possible construction of an over-temperature sensor. Third, and most importantly, the instant invention provides a massive resistance increase at this over-temperature location which when combined with a capacitance measuring technique, makes it possible to locate the over-temperature position with great accuracy. When the critial sensing temperature is exceeded in the solid conductive polymeric composition of the instant invention, the resistance increase can be four or more orders of magnitude over a small temperature range (e.g. 5° to 10° C.). The large resistance change is necessary to electrically isolate the portion of the cable beyond the hot spot so that it does not contribute to the capacitance of the cable between the control end and the hot spot, thus making precise location of the hot spot possible. The sharp change in resistance at the critical temperature facilitates construction of a monitor having adequate temperature resolution. The resistance increase only comes with falling temperature if the liquid to solid transition is used, and therefore, liquid to solid transition is of no value whatsoever in over-temperature sensing.

OBJECTS OF THE INVENTION

It is a primary object of the instant invention to provide a device that will sense an over-temperature condition and determine its location.

It is another object of the instant invention to provide an over-temperature monitor that is reusable.

It is yet another object of the instant invention to provide a sensing cable that is useful and accurate in great lengths.

It is also an object of the instant invention to provide a device whose sensor is relatively insensitive to normal resistance variations along its length due to aging and splicing or interconnecting.

It is a further object to provide an over-temperature sensing cable which detects a particular over-temperature which is fixed by selection of an appropriate PTCR conductive polymeric composition.

It is still another object to provide a cable having great flexibility and high endurance to abuse.

SUMMARY OF THE INVENTION

The purpose of the instant invention is to provide a reusable over-temperature sensor and locator. To accomplish this purpose, the instant invention provides a sensing cable and complementary electronics wherein the sensing cable comprises an electrical conductor, a dielectric, and a solid conductive polymeric composition wherein said solid conductive PTCR composition may be placed adjacent to the body whose temperature is to be monitored. At the predetermined critical temperature, the conductivity of the solid conductive polymeric composition changes dramatically, thus changing the electrical capacitance of the cable which is monitored by complementary electronics to indicate an over-temperature condition and to indicate where said over-temperature condition is located. When the over-temperature condition abates, the full cable electrical capacitance is restored and the device is then ready to operate again.

DESCRIPTION OF THE DRAWING

FIG. 1 illustrates in cross-sectional view, a cylindrical sensing cable according to the instant invention.

FIG. 2 illustrates in cross-sectional view, an alternate flat sensing cable according to the instant invention.

FIG. 3 illustrates in schematic form a capacitance measuring circuit that may be utilized for the sensing cables illustrated in FIGS. 1 and 2.

FIG. 4 illustrates in block diagram form an alternate capacitance measuring circuit that may be utilized for the sensing cables illustrated in FIGS. 1 and 2.

FIG. 5 is a resistivity versus temperature curve for a conductive polymer that may be utilized in the instant invention.

DESCRIPTION OF THE PREFERRED EMBODIMENT

With continued reference to the drawing, FIG. 1 illustrates in cross-sectional view, a cylindrical sensing cable of the instant invention comprising an inner electrical conductor 10, an intermediate dielectric layer 12 mounted coaxially over said conductor 10, and a layer of solid conductive PTCR polymeric composition 14 coaxially encapsulating conductor 10 and layer 12, and finally an outer protective layer 16. It must be noted that the outer protective layer 16 is not critial to the operation of the instant invention (other than to prevent undesired electrial contact) and is optional depending upon the environmental conditions that the sensing cable encounters. In the instant embodiment, the conductor 10 is made from copper and the dielectric layer 12 from an insulating varnish. Other conductors and dielectrics will be apparent to those skilled in the art and the use of such alternate materials is to be considered as coming within the scope of this invention. The solid conductive polymeric composition 14 may be made from a carbon loaded polyolefin or fluoropolymer. Solid conductive PTCR polymeric compositions loaded with metal powders or fibers may also be of value. Protective polymeric jacket materials such as copolymers of ethylene and chlorotrifluoroethylene ("Halar") or copolymers of ethylene and tetrafluoroethylene ("Tefzel") with special additives to meet environmental requirements may be preferred for certain applications. The jacketing or protective material preferably has a thermal conductivity sufficiently high to ensure a rapid thermal response by the solid conductive polymeric composition, which may require the protective material to be loaded with high heat conductivity material to assist heat transfer. Protective layer 16 may, therefore, be a composite of an electrical insulator next to the polymeric composition 14 and a metal braid or the like which will assist in heat transfer and protection from electrical disturbances. This composite layer 16 may be further protected as desired.

A typical polyolefin based conductive PTCR polymer formulation was prepared, having the following composition: 1633 g. (54 wt. percent) high density polyethylene ("Marlex" 6003 made by Phillips Petroleum), 1331 g. (44 wt. percent) carbon black ("Furnex" N765 made by Cities Sevices Co.) and 60.5 g. (2 wt. percent) anti oxidant (an oligomer of 4,4-thiobis(3-methyl-6-t-butyl phenol) with an average degree of polymerisation of 3 to 4, as described in U.S. Pat. No. 3,986,981). All materials were dried prior to compounding (50° C., 1 Torr for at least 16 hours). A Banbury mixer was preheated by fluxing high density polyethylene for 5 minutes. The composition ingredients were dry blended and introduced into the preheated, water cooled Banbury mixer. After mixing for 4.5 minutes in high gear, the composition was dumped, cooled to room temperature, granulated, and dried (50° C., 1 l Torr, 16 hours).

A temperature sensitive cable was prepared by extruding this composition using a 1.5 inch single screw extruder onto a 22 AWG single strand copper magnet wire, wherein the varnish insulation of the magnet wire provided the dielectric layer, to provide a final outside diameter of 0.100 inch. An insulating jacket of high density polyethylene was then extruded onto the cable using standard extrusion techniques. The entire cable was then irradiated to 20 Mrads using a 1.0 MeV electron beam.

Part of the granulated mixture was compression molded at 180° C. at a pressure of 1,000 psi for 5 minutes into a slab about 0.040 inch thick. Rectangular samples 1.0×1.5 inch were cut from the slab and irradiated to 20 Mrads to cross link the composition. Silver electrodes were provided on the samples by painting 0.25×1.0 inch strips of silver-based composition (Electrodag 504) on each end of the samples to provide 1.0×1.0×0.04 inch samples. These samples were thermally conditioned by maintaining them at 160° C. for 15 minutes by external heating and then cooling to room temperature at the rate of 1° C. per minute. Resistance values as a function of time were measured at 3° C. intervals as the sample was heated at the rate of 3° C. per minute. The resistivity values were calculated from the actual resistance measurements. A log resistivity versus temperature curve for the conductive polymer of the preferred embodiment is shown in FIG. 5.

In an idealized cable the base resistivity of the conductive polymeric composition (CPC) is very low. A cable of substantial length (greater than 1 km) can then be charged and discharged in a very short time (less than a second) without substantial voltage drop along the cable length. Practical (existing) CPC's have higher than ideal base resistivities. Ensuring that a substantial voltage drop does not occur along the cable length means a trade-off is required between length, charge/discharge time, and CPC cross-sectional area. Note especially that increasing the CPC cross-sectional area decreases the cable resistance per unit length, and this technique is a suitable means to achieve a low resistance CPC layer with non-ideal materials.

FIG. 2 illustrates a cross-sectional view a flat sensing cable comprising conductor 18, dielectric 20, solid conductive PTCR polymeric composition 22, and protective jacket 24. Material considerations are the same as for the embodiment shown in FIG. 1. In use, the cable would generally be oriented such that solid conductive polymeric composition 22 would be in closest proximity to the body whose temperature is being monitored.

An annular (doughnut) geometry is also possible with the solid conductive polymeric composition closest to the interior (hole) of the annulus. The body or mass whose temperature is to be monitored could then be passed through the hole. This configuration would provide the shortest thermal response time for long, cylindrical bodies such as electrical power cables and fluid carrying pipes.

The sensing cables of FIGS. 1 and 2, as well as other configurations utilizing 3 layers of constant cross-section, plus a jacket, will all have constant capacitance per unit length depending on the cable design parameters. The instant invention provides means for sensing a location of elevated temperature by a comparison between (1) the capacitance of the cable from the control end to the over-temperature point and (2) the capacitance of the full cable length. To accomplish this, the cable is first excited when no over-temperature points exist, so that the full capacitance is measured and stored by the control electronics. Subsequent excitations which measure a reduced capacitance means an over-temperature condition exists and the reduced capacitance can be calculated as a percentage of the full capacitance and displayed to locate the trouble. One excitation and measurement method is to charge the cable from a DC power supply or battery. When the cable reaches a preset voltage, the cable is discharged into a relatively large capacitor. The peak capacitor voltage is measured and converted to distance along the length of the cable. This distance is displayed on a digital display. The large capacitor is then discharged and the cycle repeated. Only that portion of the cable between the control end and the over-temperature point will discharge into the large capacitor. The remainder of the cable will remain isolated because at the hot spot, the solid conductive polymeric composition's resistance has risen many orders of magnitude above the base (cold) resistance.

FIG. 3 is a circuit diagram showing the essential charge/discharge components. Battery 26 charges the cable (shown to be the cable in FIG. 2) through resistor 28. Capacitor 30 of capacitance C is initially uncharged, having been bled down by bleeder resistor 32. Prior to the cable reaching the full battery voltage of battery 26 four layer diode 34 breaks down at a voltage referred to descriptively as voltage $V_{ad}$. The cable discharges completely into capacitor 30 (overdamped due to resistance of the solid conductive polymeric composition layer 22) in a short time. Capacitor 30 cannot discharge in the reverse direction because of diode 36. The voltage V of capacitor 30 is measured. The participating sensing cable capacitance is: $CV/V_{ad}$. Knowing the capacitance per foot, the location of the over-temperature is known and displayed. The display is updated every few seconds (each measurement cycle).

Measurement of the cable capacitance does not rely on propagating waves down the cable. Assuming that the base resistivity of the conductive polymeric composition is low enough to ensure uniform charging of the entire cable, then characteristic impedance is no longer an important parameter. This allows the use of existing conductive polymers in geometric forms such as flat strips, instead of coaxial cables. Overall cable resistance is not a critical parameter, allowing significant resistivity variations along the cable length due to wear, aging, splicing, or connectors.

The above circuit is but one of innumerable circuits which can be used to measure capacitance. Another such circuit utilizes integrated circuitry which measures the time to charge the sensor cable by counting clock pulses. This circuit is shown in block diagram form in FIG. 4.

The cable of the instant invention may be described as comprising an infinite number of resistance (R) and capacitance (C) sections. The cable is connected as shown as the capacitance portion of a resistance (R)/capacitance (C) network of one half of a dual monostable multivibrator 40. The R/C time constant thus formed determines the length of time that the monostable multivibrator 40 is in its "on" state. A signal from a constant frequency clock generator 44 and the signal from the monostable multivibrator 40 are added in a NAND gate 46. The output of the NAND gate 46 is a burst of pulses, the number of which is determined by the monostable multivibrator 40 "on" time. These pulses are counted by counter means 48 and displayed on a suitable digital display means 52. The other half of the dual monostable multivibrator determines the off or discharge time between charging periods.

The circuit is initially adjusted to display a set of digits which correspond to the cable's known length (in any unit of length desired) with no regions of elevated temperature. When a region of elevated temperature occurs, the proportional decrease of capacitance of the cable from the control end to the region of elevated temperature is displayed as a lesser set of digits which correspond to the location of the hot region.

FIG. 5 is a resistance versus temperature curve as discussed earlier showing the steep increase of conductive polymer resistivity with temperature. Specifically, the resistivity increases over four orders of magnitude in less than 10° C.

From the foregoing detailed description, it is evident that there are a number of changes, adaptations, and modifications of the present invention which come within the province of those skilled in the art. However, it is intended that all such variations not departing from the spirit of the invention, be considered as within the scope thereof as limited solely by the appended claims.

What is claimed is:

1. An over-temperature sense and locate device comprising:
    a. an electrical conductor;
    b. a dielectric material in contact with said electrical conductor;
    c. a solid conductive PTCR polymeric composition in contact with said dielectric material and separated from said electrical conductor by said dielectric material, said solid PTCR conductive polymeric composition being normally conductive and being capable of a massive increase in resistivity at a predetermined elevated temperature at any location along said solid PTCR conductive polymeric composition where said predetermined elevated temperature occurs; and
    d. means for sensing said location of elevated temperature, said means electrically connected to said electrical conductor and said solid conductive PTCR polymeric composition, said means comprising means for measuring and comparing the electrical capacitances between said electrical conductor and said solid PTCR conductive polymeric composition before and during exposure to said elevated temperature, the ratio of said capacitance determining the location of said elevated temperature condition.

2. A device as in claim 1 wherein said dielectric material is mounted coaxially about said electrical conductor and said solid conductive polymeric composition is mounted coaxially about said dielectric material to form a generally coaxial cable construction.

3. A device as in claim 2 wherein a protective layer is mounted coaxially over said solid conductive polymeric composition.

4. A device as in claim 3 wherein said protective layer includes a metal braid.

5. A device as in claim 1 wherein said electrical conductor, said dielectric material and said solid conductive polymeric composition are elongated flat layers to form a generally flat cable construction.

6. A device as in claim 5 wherein a protective layer is mounted around the perimeter of said flat cable.

7. A device as in claim 6 wherein said protective layer includes a metal braid.

8. A device as in claim 1 wherein said dielectric material is mounted coaxially about said solid conductive polymeric composition and said electrical conductor is mounted coaxially about said dielectric material to form a generally coaxial cable construction.

9. A device as in claim 8 wherein a protective layer is mounted coaxially about said electrical conductor.

10. A device as in claim 9 wherein said protective layer includes a metal braid.

11. A temperature sensitive cable comprising:
    a. an electrical conductor;
    b. a dielectric material in contact with said electrical conductor; and
    c. a solid conductive PTCR polymeric composition in contact with said dielectric material and separated from said electrical conductor by said dielectric material, said solid PTCR conductive polymeric composition being normally conductive and being capable of a massive increase in resistivity at a predetermined elevated temperature at any location along said solid PTCR polymeric composition where said predetermined elevated temperature occurs, wherein when said solid PTCR conductive polymeric composition and said electrical conductor are connected to a capacitance measuring device, the capacitance between said electrical conductor and said solid PTCR conductive polymeric composition may be measured before and during exposure to the elevated temperature, and the ratio of said capacitances will determine the location of predetermined elevated temperature.

12. A cable as in claim 11 wherein said dielectric material is mounted coaxially about said electrical conductor and said solid conductive polymeric composition is mounted coaxially about said dielectric material to form a generally coaxial cable construction.

13. A cable as in claim 12 wherein a protective layer is mounted coaxially about said solid conductive polymeric composition.

14. A cable as in claim 13 wherein said protective layer includes a metal braid.

15. A cable as in claim 11 wherein said electrical conductor, said dielectric material and said solid conductive polymeric composition are elongated flat layers to form a generally flat cable construction.

16. A cable as in claim 15 wherein a protective layer is mounted about the perimeter of said flat cable.

17. A cable as in claim 16 wherein said protective layer includes a metal braid.

18. A cable as in claim 11 wherein said dielectric material is mounted coaxially about said solid conductive polymeric composition and said electrical conductor is mounted coaxially about said dielectric material to form a generally coaxial cable construction.

19. A cable as in claim 18 wherein a protective layer is mounted coaxially about said electrical conductor.

20. A cable as in claim 19 wherein said protective layer includes a metal braid.

* * * * *